United States Patent
Takashima et al.

[11] Patent Number: 6,160,313
[45] Date of Patent: Dec. 12, 2000

[54] SEMICONDUCTOR DEVICE HAVING AN INSULATING SUBSTRATE

[75] Inventors: Akira Takashima; Fumihiko Taniguchi; Toshihisa Higashiyama, all of Kawasaki, Japan

[73] Assignee: Fujitsu Limited, Kawasaki, Japan

[21] Appl. No.: 09/274,939

[22] Filed: Mar. 23, 1999

[30] Foreign Application Priority Data

Mar. 31, 1998 [JP] Japan .................................. 10-087003

[51] Int. Cl.$^7$ .................................................. H01L 23/48
[52] U.S. Cl. ...................... 257/737; 257/780; 257/786; 361/760; 361/777
[58] Field of Search .................................. 257/757, 780, 257/786; 361/760, 777

[56] References Cited

U.S. PATENT DOCUMENTS

| | | | |
|---|---|---|---|
| 5,894,410 | 4/1999 | Barrow | 361/760 |
| 6,025,650 | 2/2000 | Tsuji et al. | 257/786 |
| 6,031,292 | 2/2000 | Murakami et al. | 257/778 |

FOREIGN PATENT DOCUMENTS 2-56942  2/1990  Japan .
2-87637  3/1990  Japan .

*Primary Examiner*—Olik Chaudhuri
*Assistant Examiner*—Douglas A. Wille
*Attorney, Agent, or Firm*—Armstrong, Westerman, Hattori, McLeland & Naughton

[57] ABSTRACT

A semiconductor device includes an insulating substrate; a semiconductor chip mounted on a front surface of the insulating substrate and provided with electrode pads; bonding pads provided on the front surface of the insulating substrate and electrically connected to the semiconductor chip by means of wires; ball bumps provided on a back surface of the insulating substrate in rows in a grid-like manner; electrode patterns provided in rows on the front surface of the insulating substrate so as to correspond to positions of the ball bumps, respectively, the electrode patterns being connected to the ball bumps through holes formed in the insulating substrate; and interconnection patterns electrically connecting the bonding pads and the electrode patterns. The bonding pads may be provided in a plurality of rows, each of the rows being provided between one of neighboring pairs of rows of the electrode patterns. Alternatively, the bonding pads may be provided in a staggered manner between one of neighboring pairs of rows of the electrode patterns.

12 Claims, 7 Drawing Sheets

(ROW#1)(ROW#2)

(ROW#1)(ROW#2)(ROW#3)

SEMICONDUCTOR DEVICE HAVING AN INSULATING SUBSTRATE

BACKGROUND OF THE INVENTION

1. Field of the Invention

The present invention generally relates to a semiconductor device, and particularly relates to a semiconductor device utilizing a flexible insulating substrate as a semiconductor chip mounting board and a method of manufacturing such a semiconductor device.

2. Description of the Related Art

Recently, there is a need for a semiconductor device having a high density, a high processing speed and a high-power structure. Also, there is a need for a semiconductor device having a package structure which can be obtained with a comparatively low cost.

In order to satisfy the needs above, fine-pitched package structures such as an FBGA (Fine Pitch Ball Grid Array) type structure have been developed and are now being used in various electronic devices. Among such FBGA-type packages, a package structure which uses a tape-type package for achieving a further fine-pitched structure is now becoming of a greater interest.

FIG. 1 is a partial cross-sectional view of a semiconductor device 1 of an FBGA-type of the related art. The semiconductor device 1 includes a tape 2, a semiconductor chip 4, solder balls 6 and a sealing resin 8.

The tape 2 is, for example, made of a polyimide resin. As shown in FIG. 2, a front surface 2a of the tape 2 is provided with electrode patterns 10 and bonding pads 12 formed thereon. Further, the front surface 2a of the tape 2 is provided with the semiconductor chip 4 mounted thereon. The electrode patterns 10 and the bonding pads 12 are formed on the tape 2 by, first, providing a copper layer on the tape 2 and then forming predetermined patterns, for example, by etching. Also, the electrode patterns 10 and the bonding pads 12 are electrically connected via interconnection patterns 13.

As shown in FIG. 3, wires 14 are provided between electrode pads 5 formed on a semiconductor chip 4 and bonding pads 12, respectively. Thus, the semiconductor chip 4 and the electrode patterns 10 are electrically connected via the wires 14, the bonding pads 12 and the interconnection patterns 13.

Further, the tape 2 is provided with holes 16 passing through the tape 2 at positions corresponding to the electrode patterns 10. The holes 16 may be formed by implementing a laser treatment on the tape 2.

A back surface 2b of the tape 2 is provided with solder balls 6 provided thereon. The solder balls 6 are provided at positions corresponding to the above-described holes 16 and are joined to the electrode patterns 10 via the holes 16. In other words, the solder balls 6 are fixed on the tape 2 by being joined to the electrode patterns 10.

The solder balls 6 may be joined to the electrode patterns 10 in the following manner. First, the tape 2 provided with the electrode patterns 10 and the holes 16 is reversed, so that the spherical solder balls 6 are placed above the holes 16. Then, a heating treatment is implemented so that the solder balls 6 are fused and a part of each of the solder balls 6 flows into a corresponding one of the holes 16.

Subsequently, a cooling treatment is implemented so as to cure the solder and fix the solder balls 6 to the electrode patterns 10. The solder balls 6 are joined to the electrode patterns 10 by implementing the above-described treatments. A part of the solder ball 6 protruding from the hole 16 is formed into a spherical shape due to the surface tension resulting from the fusion of the solder.

With the above-described semiconductor device 1 of an FBGA-type structure utilizing the tape 2 as a substrate, the solder balls 6 can be provided at a finer pitch. Therefore, it is possible to obtain a high-density semiconductor chip 4 and a reduced-sized semiconductor.

Now, the semiconductor device I of an FBGA type of the related art will be described in detail in regards to positioning of the electrode patterns 10 and the bonding pads 12.

Generally, the solder balls 6 are provided in a grid shape. In the embodiment shown in FIGS. 1 to 3, four rows of solder balls 6 are provided on the tape with an outermost row being referred to as Row No. 1. Therefore, the electrode patterns 10 corresponding to the positions of the solder balls 6 are also provided in four rows in a grid shape.

On the other hand, in the prior art, the bonding pads 12 whereto the wires 14 are to be connected have always been formed in a single row irrespective of the number of rows of the solder balls 6. In the embodiment shown in FIG. 2, the bonding pads 12 are provided in a single row between the first and second rows of the electrode patterns 10. Therefore, the interconnection patterns 13 connecting the electrode patterns 10 and the bonding pads 12 are provided in such a manner that they are threaded between the electrode patterns 10.

However, along with a rapid chip shrink (i.e., minimization) of the semiconductor chip 4, there is a tendency that a pitch of the electrode pads 5 is reduced resulting in a reduction of the distance between the neighboring wires 14. This causes a problem that the wires are short-circuited due to wire flow.

Also, in order to meet requirements related to the above-described structures, recent semiconductor device structures utilize structures in which the solder balls 6 and the electrode patterns 10 are also provided on the lower part of the semiconductor chip 4.

With such structures in which the electrode patterns 10 are provided adjacent to the semiconductor chip 4, the bonding pads 12 and the electrode pads 10 may be separated from each other. Thus, the tape 2 may be provided with an increased number of interconnection patterns 13 formed thereon.

However, with the fine-pitched structure, since the distance between neighboring electrode patterns 10 is reduced, the interconnection patterns 13 on the tape 2 will also be fine. Therefore, a patterning will be difficult to implement and can result in a reduction in a yield during a manufacturing process.

SUMMARY OF THE INVENTION

Accordingly, it is a general object of the present invention to provide a semiconductor device which can satisfy the needs above.

It is another and more specific object of the invention to provide a semiconductor device which is adaptive to a chip shrink and a minimization of the semiconductor device.

In order to achieve the above objects, a semiconductor device includes:
an insulating substrate;
a semiconductor chip mounted on a front surface of the insulating substrate and provided with electrode pads;
bonding pads provided on the front surface of the insulating substrate and electrically connected to the semiconductor chip by means of wires;

ball bumps provided on a back surface of the insulating substrate in rows in a grid-like manner;

electrode patterns provided in rows on the front surface of the insulating substrate so as to correspond to positions of the ball bumps, respectively, the electrode patterns being connected to the ball bumps through holes formed in the insulating substrate; and interconnection patterns electrically connecting the bonding pads and the electrode patterns, wherein the bonding pads are provided in a plurality of rows, each of the rows being provided between one of neighboring pairs of rows of the electrode patterns.

With the semiconductor device described above, the bonding pads are provided with a greater pitch, and thus there is a certain design freedom with regard to the width and configuration of the interconnection patterns. Therefore, minimization of the chip and thus minimization of the semiconductor device can be achieved. Also, yield of the semiconductor device can be improved.

Alternatively, the bonding pads may be provided in a staggered manner between one of neighboring pairs of rows of the electrode patterns. With such a structure, since the pitch between the bonding pads is increased, wire bonding may be implemented with a relatively high accuracy even in a case of an increased number of electrodes of the semiconductor chip.

Also, the bonding pads may be omitted, so that the electrode pads and the electrode patterns are electrically connected by means of wires. With such a structure, the wires can be bonded onto the tape with a greater pitch. Therefore, there is a certain design freedom with regard to the width and configuration of the interconnection patterns. Therefore, it is possible to increase the number of electrodes and miniaturize the chip.

Further, heat-dissipation ball bumps may be provided on the back surface of the insulating substrate at positions corresponding to the position at which the semiconductor chip is mounted on the insulating substrate. With such a structure, it is possible to improve the heat dissipation efficiency.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 4:
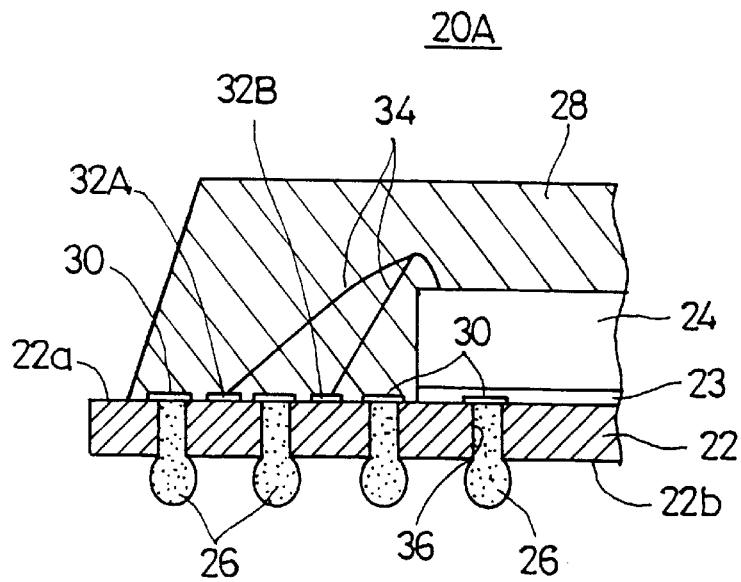
FIG. 4 is a partial cross-sectional view of a semiconductor device of a first embodiment of the present invention.
Figure 5:
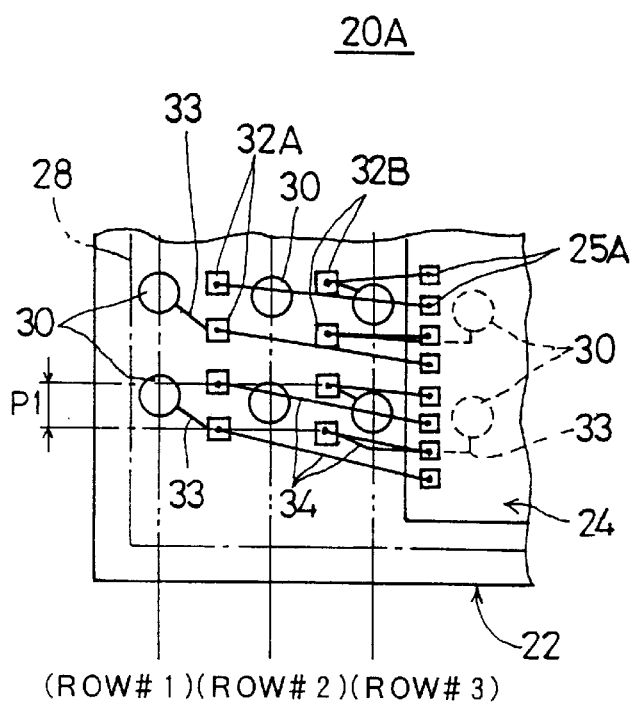
FIG. 5 is a partial plan view of the semiconductor device of the first embodiment illustrated without a sealing resin.

FIG. 4 is a partial cross-sectional view of a semiconductor device 20A of a first embodiment of the present invention. FIG. 5 is a partial plan view of the semiconductor device 20A of the first embodiment illustrated without a sealing resin 28. For a better understanding, a contour of the sealing resin 28 is indicated in a dash-dot line.

As shown in FIGS. 4 and 5, the semiconductor device of the present embodiment has a package structure of an FBGA type in order to achieve a fine-pitched structure. The semiconductor device 20A includes a tape 22 (an insulating substrate), a semiconductor chip 24, solder balls 26 (ball bumps) and the sealing resin 28.

The tape 22 can be a flat substrate made of a material such as a polyimide resin, glass epoxy and a ceramic material. As shown in FIG. 4, the tape 22 is provided with the semiconductor chip 24, the sealing resin 28, electrode patterns 30 and bonding pads 32A, 32B formed on its front surface 22a. Also, the solder balls 26 are provided on the back surface 22b of the tape 22.

The electrode patterns 30 and the bonding pads 32A, 32B are formed by a gold-plated copper layer, and a metal having good joining ability with solder and gold is coated thereon.

The electrode patterns 30 are provided at positions corresponding to the positions of the solder balls 26 described later. Also, the electrode patterns 30 and the bonding pads 32A, 32B are electrically connected by interconnection patterns 33 (see FIG. 5). The interconnection patterns 33 are formed on the front surface 22a of the tape 22 so as to be integral with the electrode patterns 30 and the bonding pads 32A, 32B.

The semiconductor chip 24 is fixed on the tape 22 by means of an adhesive agent 23. Wires 34 made of gold are provided between electrode pads 25A provided on the semiconductor chip 24 and the bonding pads 32A, 32B provided on the tape 22. In the present embodiment, the electrode pads 25A are provided in a single row along the periphery of the semiconductor chip 24. (In the following, the electrode pads 25A will be referred to as single-row electrode pads 25A.)

The wires are bonded by means of a wire-bonding machine. Therefore, the semiconductor chip 24 is electrically connected to the electrode patterns 30 via the wires 34, the bonding pads 32A, 32B and the interconnection patterns 33.

Also, the tape 22 is provided with holes 36 passing through the tape 22 at positions corresponding to the electrode patterns 30. The holes 36 may be formed by implementing a laser treatment on the tape 22.

The solder balls 26 are provided on the back surface 22b of the tape 22. The solder balls 26 serve as external connection terminals of the semiconductor device 20A. The solder balls 26 are provided at positions corresponding to the above-described holes 36, that is to say, positions corresponding to the electrode patterns 30. The solder ball 26 has a spherical ball part protruding from the back surface 22b of the tape 22 and a columnar part positioned within the hole 36.

In the following, a method of manufacturing the semiconductor device 20A of the above-described structure will be described in brief.

In order to manufacture the semiconductor device 20A, first of all, the tape 22 is prepared. Prior to the manufacturing process, there is no component provided on the tape 22 either on the front surface 22a or on the back surface 22b. First, the tape 22 is subjected to a pattern forming process in which a copper layer is formed on the front surface 22a of the tape 22 using, for example, a plating technique. Then, predetermined patterns of the electrode patterns 30, bonding pads 32A, 32B and the interconnection pattern 33 are formed on the front surface 22a of the tape 22 using a photolithography technique and an etching technique.

As has been described, in the pattern forming process, the electrode patterns 30, the bonding pads 32A, 32B and the interconnection patterns 33 are simultaneously provided on the front surface 22a of the tape 22. Therefore, even if the bonding pads 32A, 32B are divided into a plurality of rows (in the present embodiment, two rows), there is no need for a new manufacturing process which can increase a manufacturing cost.

After the above-described pattern forming process, a hole forming process is implemented. In the hole forming process, the tape 22 is fitted onto a laser treatment machine so that the holes 36 are formed by means of laser beams.

After the hole forming process, a chip mounting process is implemented. In the chip mounting process, the semiconductor chip 24 is mounted on the front surface 22a of the tape 22 using the adhesive agent 23. Also, the wires 34 are provided between the semiconductor chip 24 and the bonding pads 32A, 32B.

The wires 34 may be provided by means of a wire-bonding machine.

Then, a sealing process is implemented. The sealing resin 28 is provided on the front surface 22a of the tape 22 so as to cover the semiconductor chip 24, the electrode patterns 30, the bonding pads 32A, 32B and the wires 34. The sealing resin 28 is formed by a known molding technique.

After the sealing process, a bump forming process is implemented. In the bump-forming process, the spherical solder balls 26 are electrically connected to the electrode patterns 30 via the holes 36. In detail, first, the tape 22 is reversed, so that the spherical solder balls 26 are placed above the holes 36. Then, a heating treatment is implemented so that the solder balls 26 are fused and a part of each of the solder balls 26 flows into a corresponding one of the holes 36. The part of each of the solder balls 26 in the hole 36 forms a columnar part. Subsequently, a cooling treatment is implemented.

Thus, the solder in the holes 36 is joined to the electrode patterns 30 in an electrically and mechanically connected manner. Also, a part of the solder ball 26 protruding from the back surface 22b of the tape 22 is formed into a spherical shape due to the surface tension resulting from the fusion of the solder. The semiconductor device 20A shown in FIGS. 4 and 5 is manufactured by implementing the series of processes described above.

Figure 1:
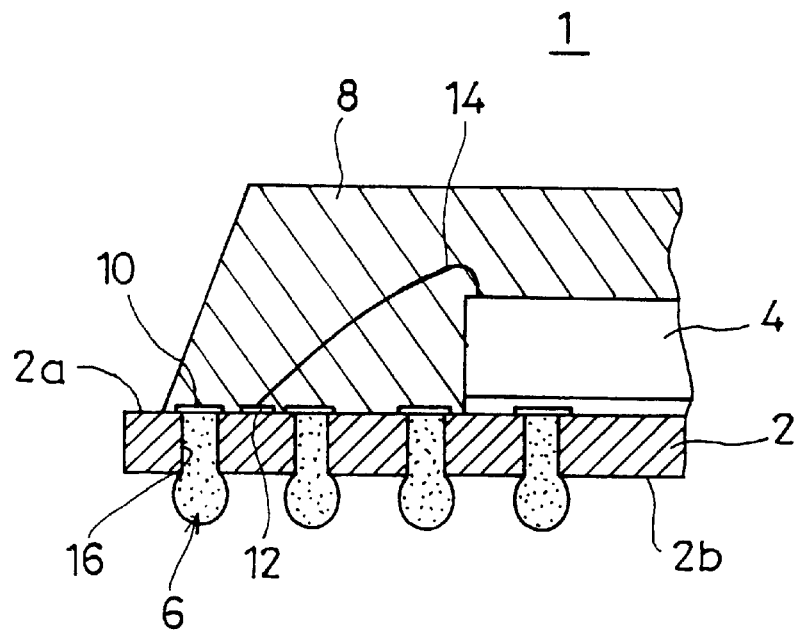
FIG. 1 is a partial cross-sectional view of a semiconductor device of the related art.

Now, a structure of the bonding pads 32A, 32B constituting an essential part of the present embodiment will be described by comparison to that of the semiconductor device 1 of the related art shown in FIGS. 1 to 3.

Figure 2:
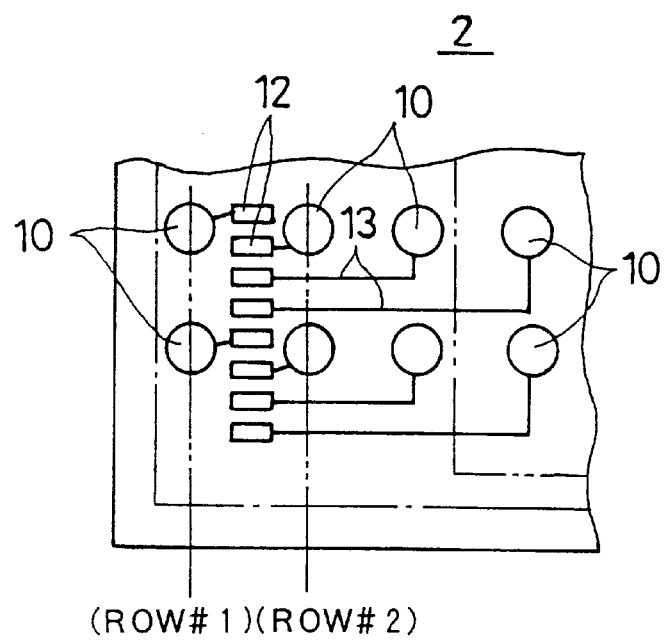
FIG. 2 is a partial plan view of a tape provided on the semiconductor device shown in FIG. 1.
Figure 3:
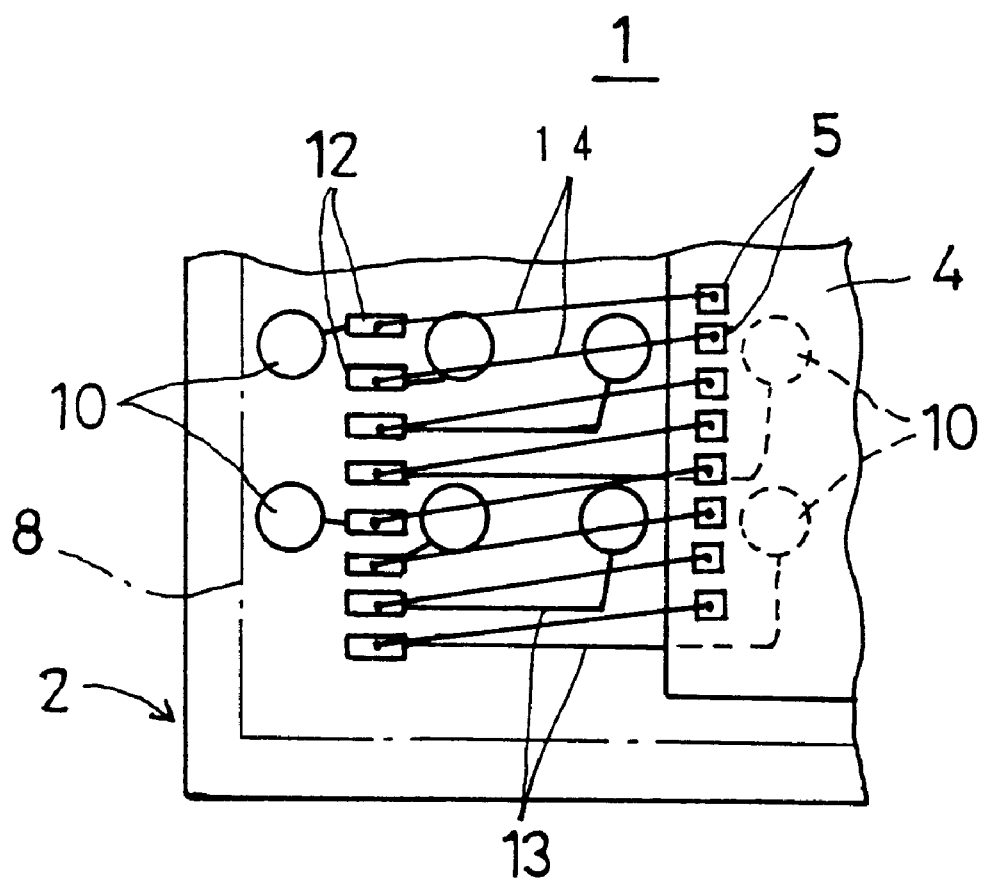
FIG. 3 is a partial plan view of the semiconductor device shown in FIG. 1 illustrating a state without a sealing resin.

Referring to FIGS. 2 and 3, the semiconductor device 1 of the related art includes bonding pads 12 provided in a single row (in the figures, eight bonding pads 12 in a single row) between a pair of neighboring rows of the electrode patterns 10. However, in the present embodiment, the bonding pads 32A, 32B are divided into a plurality of rows, each row being provided between one of neighboring rows of the electrode patterns 30.

In other words, in the embodiment shown in FIG. 5, eight bonding pads are divided into two rows, each row including four bonding pads 32A, 32B. The first row of bonding pads 32A is provided between a pair of the first and second rows of the electrode patterns 30 and the second row of bonding pads 32B is provided between a pair of the second and third rows of the electrode patterns 30.

Therefore, by dividing the bonding pads into a plurality of rows, the pitch between neighboring bonding pads included in that row will be greater. Referring to FIG. 5, the bonding pads are provided in two rows 32A, 32B with a pitch P1 that is greater than the pitch between the bonding pads 12 of the related art.

Also, it is possible to reduce the number of interconnection patterns 33 threaded between the neighboring electrode patterns 30 of one of the rows of electrode patterns. In the related art shown in FIG. 2, two interconnection patterns 13 are threaded between the neighboring electrode patterns 30 of one of the rows of electrode patterns. In the present embodiment shown in FIG. 5, all electrode patterns 30 and the bonding pads 32A, 32B may be electrically connected while only one interconnection pattern 33 is threaded between the neighboring electrode patterns 30 of one of the rows of electrode patterns.

With the semiconductor device 20A of the present embodiment, there is a certain design freedom with regard to the width and configuration of the interconnection patterns 33. Therefore, minimization of the chip and thus minimization of the semiconductor device 20A can be achieved. Also, yield of the semiconductor device 20A (interconnection patterns 33) can be improved.

Figure 6:
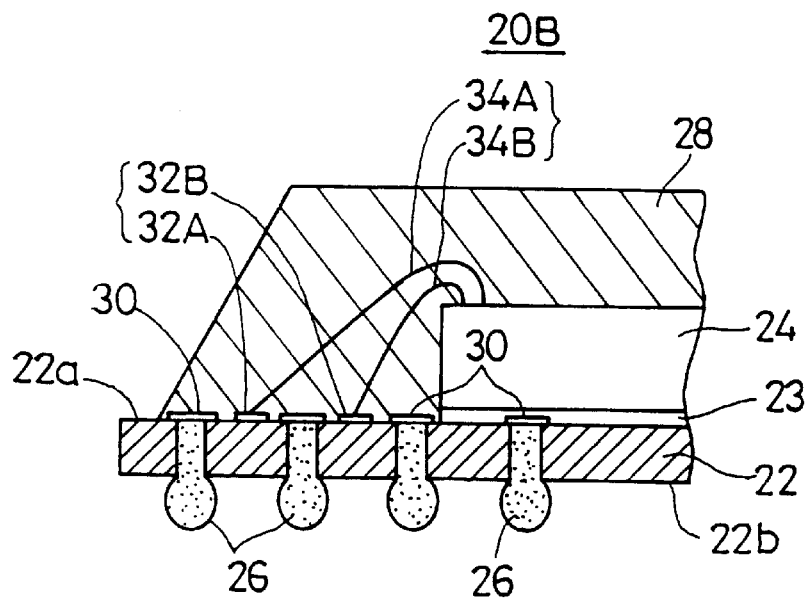
FIG. 6 is a partial cross-sectional view of a semiconductor device of a second embodiment of the present invention.
Figure 7:
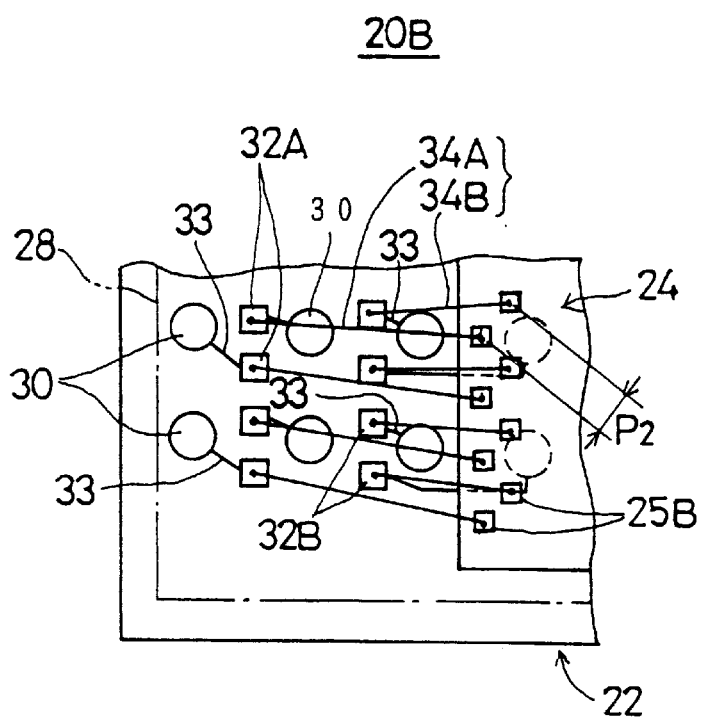
FIG. 7 is a partial plan view of the semiconductor device of the second embodiment illustrated without a sealing resin.

In the following, a semiconductor device 20B of a second embodiment of the present invention will be described with reference to FIGS. 6 and 7. FIG. 6 is a partial cross-sectional view of the semiconductor device 20B of the second embodiment of the present invention. FIG. 7 is a partial plan view of the semiconductor device 20B of the second embodiment illustrated without a sealing resin 28. For a better understanding, a contour of the sealing resin 28 is indicated in a dash-dot line. In FIGS. 6 and 7, structures identical to those of the semiconductor 20A of the first embodiment shown in FIGS. 4 and 5 are indicated with identical reference numerals, and will not be described in detail. This also applies to other embodiments of the present invention.

The semiconductor device 20A of the first embodiment of the present invention includes the electrode pads 25A provided in a single row along the periphery of the chip semiconductor chip 24. Hereinafter, such electrode pads 25A may be referred to as single-row electrode pads 25A. Also, note that in the first embodiment of the present invention, the wires 34 connecting the single-row electrode pads 25A and the bonding pads 32A, 32B are all provided at the same level.

The semiconductor device 20B of the present embodiment includes electrode pads 25B provided on the semiconductor chip 24 in a staggered manner. (Hereinafter, such electrode pads 25B may be referred to as staggered electrode pads 25B.) Also, the wires 34A, 34B are provided at different levels in such a manner that upper wires 34A and lower wires 34B are alternately connected to the staggered electrode pads 25B.

Thus, in the present embodiment, as shown in FIG. 7, a pitch between the electrode pads 25B can be increased as compared to that between the single-row electrode pads 25A of the first embodiment. This is shown as a pitch P2 between the neighboring ones of the staggered electrode pads 25B provided on the semiconductor chip 24. Thus, the wires 34A, 34B can also be bonded onto the semiconductor chip 24 with a greater pitch. Thereby, wire bonding may be implemented with a relatively high accuracy even in a case of an increased number of electrodes of the semiconductor chip 24.

Also, since the wires 34A, 34B are provided at different levels in such a manner that upper wires 34A and lower wires 34B are alternately connected to the staggered electrode pads 25B, the wires 34A, 34B are prevented from being short-circuited on the chip side. This is also possible even in a case where the number of electrodes of the semiconductor chip 24 is increased. Therefore, it is possible to achieve a miniaturization of the semiconductor chip 24.

Figure 8:
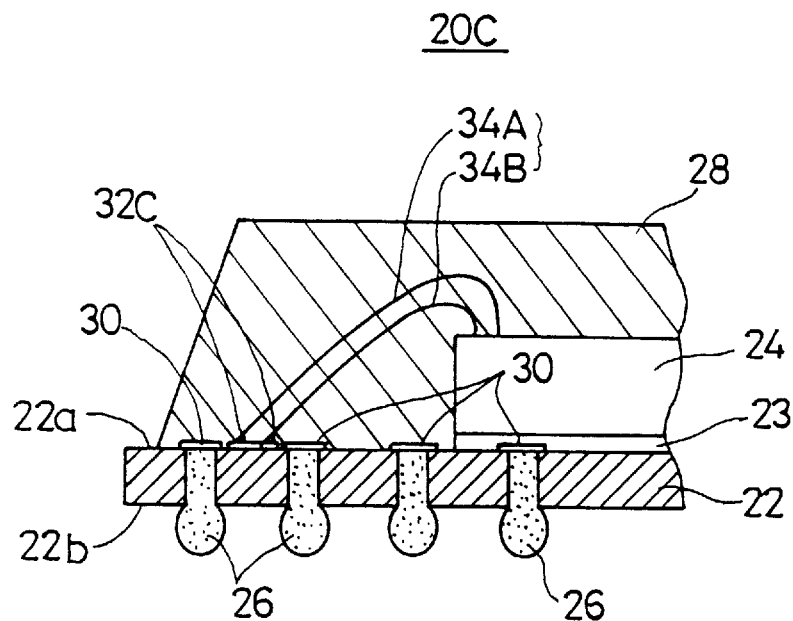
FIG. 8 is a partial cross-sectional view of a semiconductor device of a third embodiment of the present invention.
Figure 9:
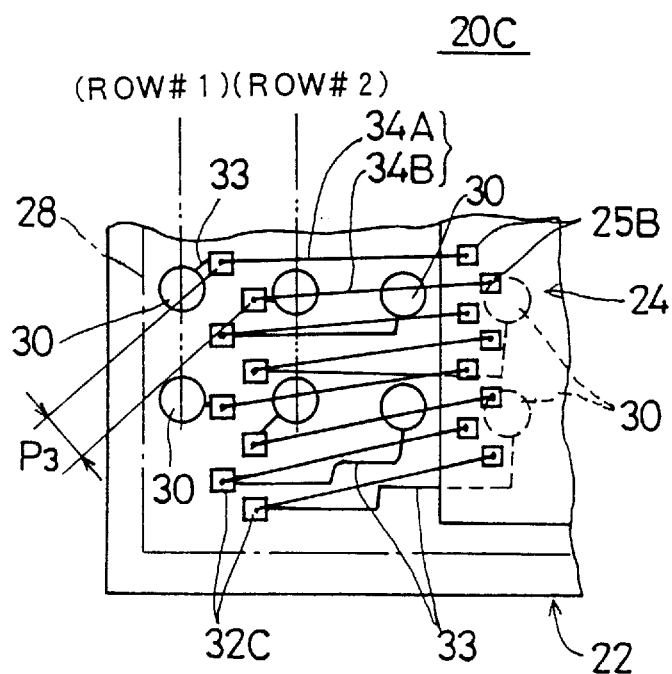
FIG. 9 is a partial plan view of the semiconductor device of the third embodiment illustrated without a sealing resin.

In the following, a semiconductor device 20C of a third embodiment of the present invention will be described with reference to FIGS. 8 and 9. FIG. 8 is a partial cross-sectional view of the semiconductor device 20C of the third embodiment of the present invention. FIG. 9 is a partial plan view of the semiconductor device 20C of the third embodiment illustrated without a sealing resin 28. For a better understanding, a contour of the sealing resin 28 is indicated in a dash-dot line.

Referring again to FIG. 7, the semiconductor device 20B of the second embodiment includes the semiconductor chip 24 provided with the staggered electrode pads 25B. Now referring to FIGS. 8 and 9, the semiconductor device 20C of the third embodiment of the present invention includes bonding pads 32C provided in a staggered manner. (In the following, these bonding pads 32C are referred to as staggered bonding pads 32C.)

In detail, in the present embodiment, the staggered bonding pads 32C are provided between the first and second rows of the electrode patterns 30. Also, the wires 34A, 34B are provided in a similar manner to those of the second embodiment so as to prevent the wires from being short-circuited.

Thus, in the present embodiment, as shown in FIG. 9, a pitch between the staggered bonding pads 32C can be increased compared to the structure where the bonding pads 12 are provided in a single row (see FIGS. 2 and 3). This is shown as a pitch P3 between the neighboring ones of the staggered bonding pads 32C provided on the semiconductor chip 24.

Again, the wires 34A, 34B can be bonded onto the semiconductor chip 24 with a greater pitch. Thereby, wire bonding may be implemented with a relatively high accuracy even in a case of an increased number of electrodes of the semiconductor chip 24.

The present embodiment has been described using an example in which the staggered bonding pads 32C are provided between a pair of the first and second rows of the electrode patterns 30. However, it is also possible to provide the staggered bonding pads 32C between an other pair of rows of electrode patterns 30. Also, the electrode pads can either be the single-row electrode pads 25A or the staggered electrode pads 25B.

Figure 10:
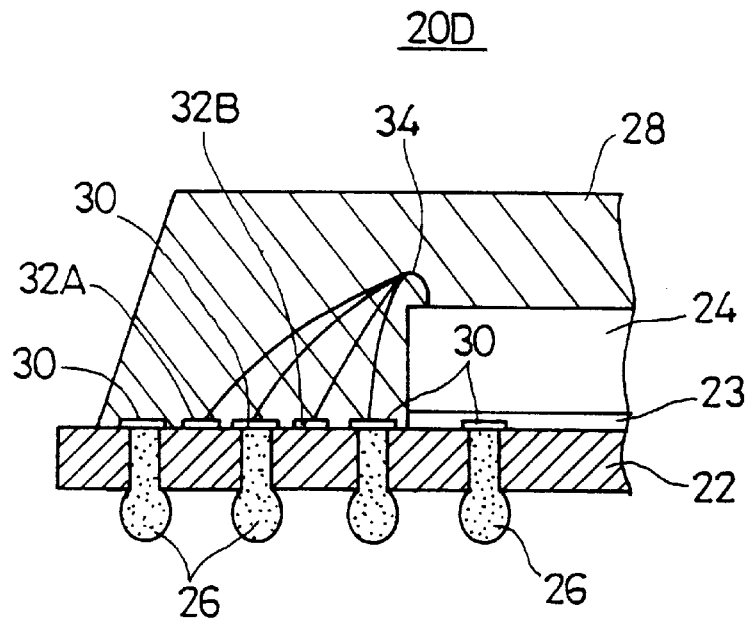
FIG. 10 is a partial cross-sectional view of a semiconductor device of a fourth embodiment of the present invention.
Figure 11:
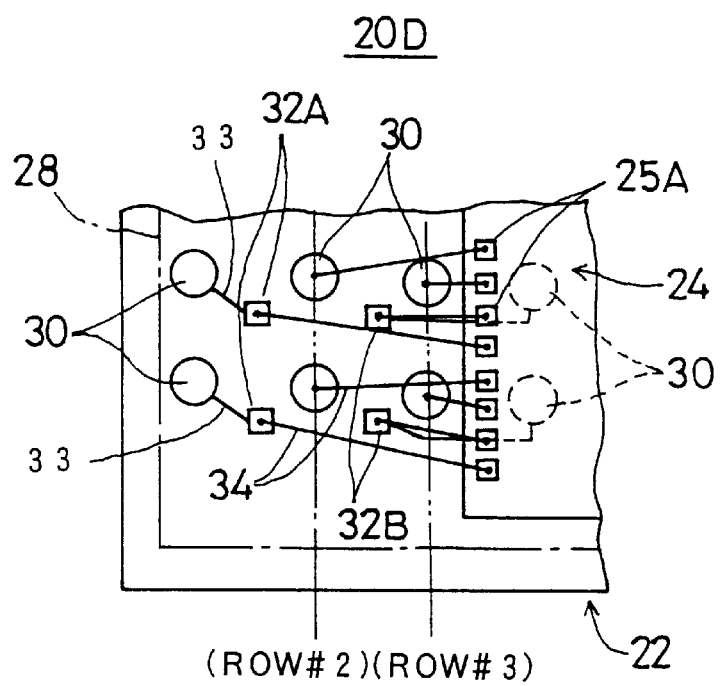
FIG. 11 is a partial plan view of the semiconductor device of the fourth embodiment illustrated without a sealing resin.

In the following, a semiconductor device of a fourth embodiment 20D of the present invention will be described with reference to FIGS. 10 and 11. FIG. 10 is a partial cross-sectional view of the semiconductor device 20D of the fourth embodiment of the present invention. FIG. 11 is a partial plan view of the semiconductor device 20D of the fourth embodiment illustrated without a sealing resin 28. For a better understanding, a contour of the sealing resin 28 is indicated in a dash-dot line.

All of the embodiments described above include the bonding pads 32A to 32C electrically connected to the electrode patterns 30 provided on the tape 22, in order to electrically connect the electrode pads 25A, 25B formed on the semiconductor chip 24 to the solder balls 26. The bonding pads 32A to 32C and the electrode pads 25A, 25B are connected by means of the wires 34, 34A, 34B.

The semiconductor device 20D of the present embodiment is provided with the wires 34 that directly connect the electrode pads 25A and the electrode patterns 30. Therefore, the bonding pads 32A to 32C can be dispensed with. Thus, the wires 34 can be bonded onto the tape 22 with a greater pitch. Therefore, there is a certain design freedom with regard to the width and configuration of the inter connection patterns 33. Therefore, it is possible to increase the number of electrodes and miniaturize the chip.

It is to be noted that it is not necessary to omit all the bonding pads 32A to 32C, depending on the interconnection layout of the wires 34 and the pattern layout of the interconnection patterns 33. As shown in FIG. 11, a mixed structure including the wires 34 directly connected to the electrode patterns 30 and the wires 34 connected to the bonding pads 32A, 32B is also possible.

Figure 12:
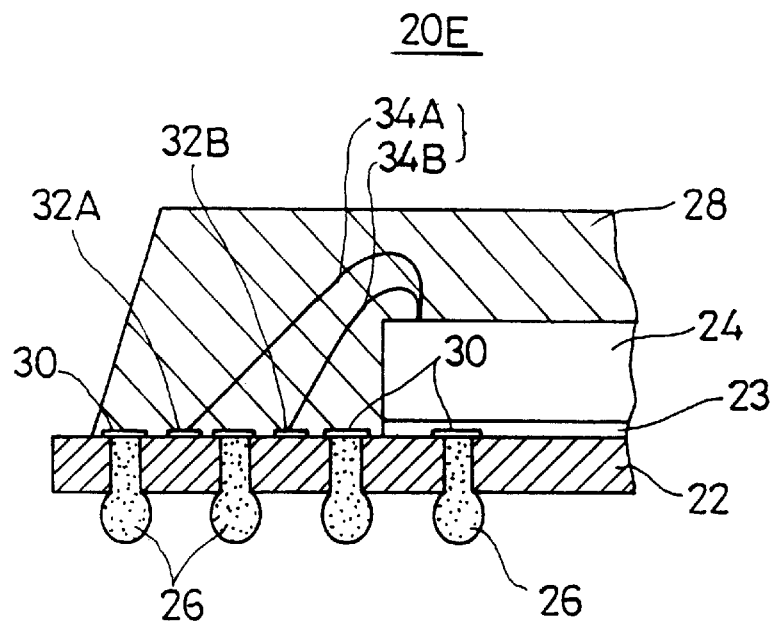
FIG. 12 is a partial cross-sectional view of a semiconductor device of a fifth embodiment of the present invention.

In the following, a semiconductor device of a fifth embodiment 20E of the present invention will be described with reference to FIG. 12. The semiconductor device 20E of the present embodiment has a structure similar to that of the semiconductor device 20A of the first embodiment. The difference is that the wires 34A, 34B are provided in such a manner that upper wires 34A and lower wires 34B are alternately provided with the neighboring wires 34A, 34B being provided at different levels.

Thus, with the structure according to the present embodiment, the neighboring wires 34A and 34B are prevented from being short-circuited. Therefore, the wires 34A, 34B are prevented from being short-circuited on the chip side, even in a case of an increased number of electrodes of the semiconductor chip 24. Therefore, it is possible to miniaturize the semiconductor chip 24.

Figure 13:
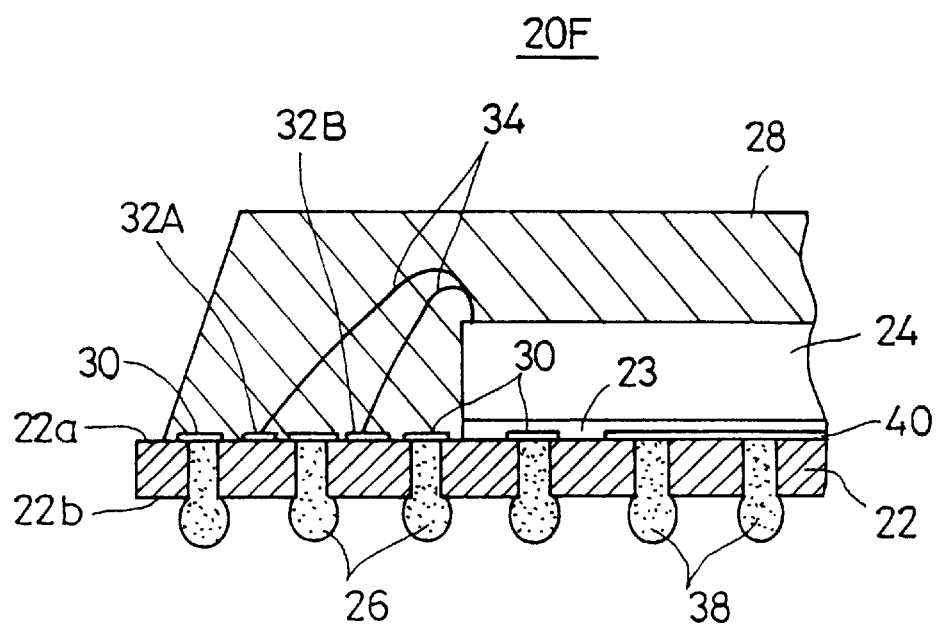
FIG. 13 is a partial cross-sectional view of a semiconductor device of a sixth embodiment of the present invention.

In the following, a semiconductor device of a sixth embodiment 20F of the present invention will be described with reference to FIG. 13. The semiconductor device 20F of the present embodiment includes heat-dissipation ball bumps 38 provided on the back surface 22b at positions corresponding to the position at which the semiconductor chip 24 is mounted on the tape 22. The heat-dissipation ball bump 38 may have a structure similar to that of the solder ball 26 or may be formed of an other material, for example, copper, having a good heat-dissipation characteristic.

Also, a heat-dissipation land 40 is provided at the lower part of the semiconductor chip 24. The heat-dissipation land 40 may be formed of copper foil and is thermally connected to the heat-dissipation ball bumps 38. Since the heat-dissipation land 40 is provided adjacent to the semiconductor chip 24, the heat-dissipation ball bumps 38 are thermally connected to the semiconductor chip 24.

It is to be noted that such a structure having the heat-dissipation ball bumps can be combined with any one of the above-described embodiments of the present invention.

By thermally connecting the heat-dissipation ball bumps 38 and the semiconductor chip 24, as in the present embodiment, heat produced in the semiconductor chip 24 is dissipated via the heat-dissipation land 40 and the heat-dissipation ball bumps 38. Therefore, it is possible to improve the heat dissipation efficiency.

Further, the present invention is not limited to these embodiments, but variations and modifications may be made without departing from the scope of the present invention.

The present application is based on Japanese priority application No. 10-087003 filed on Mar. 31, 1998, the entire contents of which are hereby incorporated by reference.

What is claimed is:

1. A semiconductor device comprising:

an insulating substrate;

a semiconductor chip mounted on a front surface of said insulating substrate and provided with electrode pads;

bonding pads provided on said front surface of the insulating substrate and electrically connected to said semiconductor chip by means of wires;

ball bumps provided on a back surface of the insulating substrate in rows in a grid-like manner;

electrode patterns provided in rows on the front surface of the insulating substrate so as to correspond to positions of said ball bumps, respectively, said electrode patterns being connected to said ball bumps through holes formed in the insulating substrate; and interconnection patterns electrically connecting said bonding pads and said electrode patterns, wherein said bonding pads are provided in a plurality of rows, each of said rows being provided between one of neighboring pairs of rows of said electrode patterns.

2. The semiconductor device as claimed in claim 1, wherein said electrode pads provided on said semiconductor chip are provided in a staggered manner.

3. The semiconductor device as claimed in claim 1, wherein neighboring ones of said wires are provided at different levels.

4. The semiconductor device as claimed in claim 2, wherein neighboring ones of said wires are provided at different levels.

5. The semiconductor device as claimed in claim 1, further comprising heat-dissipation ball bumps provided on the back surface of the insulating substrate at positions corresponding to the position at which the semiconductor chip is mounted on the insulating substrate, wherein said heat-dissipation ball bumps are thermally connected to said semiconductor chip.

6. A semiconductor device comprising:

an insulating substrate;

a semiconductor chip mounted on a front surf ace of said insulating substrate and provided with electrode pads;

bonding pads provided on said front surface of the insulating substrate and electrically connected to said semiconductor chip by means of wires;

ball bumps provided on a back surface of the insulating substrate in rows in a grid-like manner;

electrode patterns provided in rows on the front surface of the insulating substrate so as to correspond to positions of said ball bumps, respectively, said electrode patterns being connected to said ball bumps through holes formed in the insulating substrate; and interconnection patterns electrically connecting said bonding pads and said electrode patterns, wherein said bonding pads are provided in a staggered manner between one of neighboring pairs of rows of said electrode patterns.

7. The semiconductor device as claimed in claim 6, wherein said electrode pads provided on said semiconductor chip are provided in a staggered manner.

8. The semiconductor device as claimed in claim 6, wherein neighboring ones of said wires are provided at different levels.

9. The semiconductor device as claimed in claim 7, wherein neighboring ones of said wires are provided at different levels.

10. The semiconductor device as claimed in claim 6, further comprising heat-dissipation ball bumps provided on the back surface of the insulating substrate at positions corresponding to the position at which the semiconductor chip is mounted on the insulating substrate, wherein said heat-dissipation ball bumps are thermally connected to said semiconductor chip.

11. A semiconductor device comprising:

an insulating substrate;

a semiconductor chip mounted on a front surface of said insulating substrate and provided with electrode pads;

bonding pads are provided on said front surface of the insulating substrate and electrically connected to said semiconductor chip by means of wires;

ball bumps provided on a back surface of the insulating substrate in rows in a grid-like manner; and electrode patterns provided in rows on the front surface of the insulating substrate so as to correspond to positions of said ball bumps, respectively, said electrode patterns being connected to said ball bumps through holes formed in the insulating substrate, wherein said bonding pads are provided in a plurality of rows, each of the rows being provided between one of neighboring pairs of rows of the electrode patterns and wherein said electrode pads and said electrode pattern are electrically connected by means of wires.

12. The semiconductor device as claimed in claim 11, further comprising heat-dissipation ball bumps provided on the back surface of the insulating substrate at positions corresponding to the position at which the semiconductor chip is mounted on the insulating substrate, wherein said heat-dissipation ball bumps are thermally connected to said semiconductor chip.

* * * * *